(12) United States Patent
Pomerene et al.

(10) Patent No.: US 8,666,206 B2
(45) Date of Patent: Mar. 4, 2014

(54) ASYMMETRIC SLOTTED WAVEGUIDE AND METHOD FOR FABRICATING THE SAME

(75) Inventors: Andrew T S Pomerene, Leesburg, VA (US); Wesley D. Reinhardt, Washington, DC (US); Craig M. Hill, Warrenton, VA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 34 days.

(21) Appl. No.: 13/581,075

(22) PCT Filed: Dec. 2, 2011

(86) PCT No.: PCT/US2011/062980
§ 371 (c)(1),
(2), (4) Date: Aug. 24, 2012

(87) PCT Pub. No.: WO2012/075351
PCT Pub. Date: Jun. 7, 2012

(65) Prior Publication Data
US 2012/0321246 A1      Dec. 20, 2012

Related U.S. Application Data

(60) Provisional application No. 61/419,464, filed on Dec. 3, 2010.

(51) Int. Cl.
*G02B 1/11* (2006.01)
*H01L 27/12* (2006.01)
*H01L 33/00* (2010.01)
*H01L 21/302* (2006.01)
*G03F 7/20* (2006.01)

(52) U.S. Cl.
USPC ............... 385/14; 430/325; 438/22; 438/624

(58) Field of Classification Search
USPC ......... 385/14, 15, 16, 24, 39, 147; 430/286.1, 430/312, 325, 618; 438/22, 48, 624, 689, 438/710
See application file for complete search history.

(56) References Cited

U.S. PATENT DOCUMENTS 4,638,323 A * 1/1987 Shnitkin et al. ............... 343/771
4,910,122 A * 3/1990 Arnold et al. ................. 430/313

(Continued)

OTHER PUBLICATIONS

Bogaerts et al., Nanophotonic Waveguides in Silicon-on-Insulator Fabricated With CMOS Technology, Journal of Lightwave Technology, Jan. 2005, vol. 23, No. 1, pp. 401-412. See figures 2; section 2. SOI nanophotonic waveguides.

(Continued)

*Primary Examiner* — Akm Enayet Ullah
(74) *Attorney, Agent, or Firm* — Daniel J. Long

(57) ABSTRACT

An asymmetric slotted waveguide and method for fabricating the same. The slotted waveguide is constructed in silicon-on-insulator using a Complementary metal-oxide-semiconductor (CMOS) process. One or more wafers can be coated with a photo resist material using a photolithographic process in order to thereby bake the wafers via a post apply bake (PAB) process. An anti-reflective coating (TARC) can be further applied on the wafers and the wafers can be exposed on a scanner for the illumination conditions. After a post exposure bake (PEB), the wafers can be developed in a developer using a puddle develop process. Finally, the printed wafers can be processed using a shrink process to reduce the critical dimension (CD) of the slot and thereby achieve an enhanced asymmetric slotted waveguide that is capable of guiding the optical radiation in a wide range of optical modulation applications using an electro-optic polymer cladding.

18 Claims, 2 Drawing Sheets

(56) References Cited

U.S. PATENT DOCUMENTS

| | | | |
|---|---|---|---|
| 5,638,079 A * | 6/1997 | Kastner et al. | 343/770 |
| 6,449,080 B1 * | 9/2002 | McBrien et al. | 359/245 |
| 2003/0176002 A1 * | 9/2003 | Zhang et al. | 438/22 |
| 2008/0160285 A1 * | 7/2008 | Chen | 428/315.7 |

OTHER PUBLICATIONS

Baehr-Jones et al., Optical Modulation and Detection in Slotted Silicon Waveguides, Optics Express, Jul. 11, 2005, vol. 13, No. 14, pp. 5216-5226. See abstract; sections 1. Introduction 2. Device fabrication.

* cited by examiner

ASYMMETRIC SLOTTED WAVEGUIDE AND METHOD FOR FABRICATING THE SAME

CROSS-REFERENCE TO RELATED APPLICATIONS

This Application claims rights under 35 USC §119(e) from U.S. Application Ser. No. 61/419,464 filed Dec. 3, 2010, the contents of which are incorporated herein by reference.

TECHNICAL FIELD

Embodiments are generally related to slotted measuring waveguides. Embodiments are also related to the complementary metal-oxide-semiconductor (CMOS) process. Embodiments are additionally related to methods for fabricating slotted waveguides using the CMOS process.

BACKGROUND OF THE INVENTION

Electra-optic materials such as for example, but not limited to gallium arsenide (GaAs) and lithium niobate (Lib03) are employed in wide range of electronic/photonic processes for processing optical signals. The electro-optic materials can change their optical properties in response to an electrical effect. Such materials are widely incorporated within the electronic devices for use in the telecommunications field in order to perform processing activities such as, for example, but not limited to, optical signal switching, the modulation of optical signals, the demodulation of optical signals and the compensation of optical signals for dispersion effects that occur during the signal transmission.

Typically, the electro-optic materials are incorporated within a ridge waveguide structure in which the ridge waveguide guides are designed to substantially contain the optical signal. The electro optic material can either be located within a slot within the ridge waveguide, or can be used to form the ridge waveguide. The ridge can be either freestanding or embedded within another material.

A slotted waveguide is especially useful for making impedance measurements. A probe extends through the slot into the waveguide for detecting the intensity of the radio frequency (RF) field at the tip of a probe supported by a carriage on calibrated ways. The distance between a maximum and adjacent minimum is an accurate measure of the wavelength of the RF energy inside the waveguide with the ratio of the maximum to the minimum being representative of the VSWR of the circuit to which the slotted line is coupled. For performing accurate measurements the VSWR of the slotted waveguide itself should be as near to unity as possible. At higher frequencies where the span of the waveguide cross section is physically small, it has been difficult to achieve the desired high accuracies.

Most of the prior art methods for fabricating the strip loaded waveguide are very slow and impractical for growing waveguide structures that are compatible for a wide range of electro-optic modulations. Further, the prior art processes may increase the amount of contaminants in the waveguide structure. Such contaminants may also contribute to optical losses in the waveguide structure.

Based on the foregoing, it is believed that a need exist for an improved asymmetric strip loaded slot waveguides for electro-optic modulation. A need also exists for an improved method for fabricating the asymmetric strip loaded slot waveguide using a CMOS process, as described in greater detail herein.

BRIEF SUMMARY

The following summary is provided to facilitate an understanding of some of the innovative features unique to the disclosed embodiments and is not intended to be a full description. A full appreciation of the various aspects of the embodiments disclosed herein can be gained by taking the entire specification, claims, drawings, and abstract as a whole.

It is, therefore, one aspect of the disclosed embodiments to provide for an improved slotted waveguide.

It is another aspect of the disclosed embodiments to provide for an improved asymmetric strip loaded slot waveguide.

It is further aspect of the disclosed embodiments to provide for an improved method and a product of the method for fabricating the asymmetric strip loaded slot waveguide using a CMOS process.

The aforementioned aspects and other objectives and advantages can now be achieved as described herein. An asymmetric slotted waveguide and method for fabricating the same, is disclosed herein. The slotted waveguide is constructed in silicon-on-insulator using a Complementary metal-oxide-semiconductor (CMOS) process. One or more wafers (e.g., a silicon wafer) can be coated with a photo resist material using a photolithographic process in order to thereby bake the wafers via a post apply bake (PAB) process. An anti-reflective coating (TARC) can be further applied on the wafers and the wafers can be exposed on a scanner (e.g., an ASML 850C DUV scanner) for the illumination conditions. After a post exposure bake (PEB), the wafers can be developed in a developer (AZ 300 MIF developer) using a puddle develop process (a single 60 s puddle develop process). Finally, the printed wafers can be processed using a shrink process to reduce the critical dimension (CD) of the slot and thereby achieve an enhanced asymmetric slotted waveguide that is capable of guiding the optical radiation in a wide range of optical nodulation applications using an electro-optic polymer cladding.

A standard photolithographic process (e.g., a standard 248 nm DUV photolithographic process) can be adapted to coat the photo resist material on the wafers. An additional shrinking process can be performed to shrink the critical dimension of the features of the printed wafer. The anti-reflective coating (TARC) applied on the wafers can be such as, for example, an AZ Electronics Aquatar VII at a thickness of 430 Å. The anti-reflective coating can be an aqueous material that is removed from the wafers during the puddle develop process. The coat/develop portion of the puddle develop process can be performed on a FSI Polaris 2500 Lithography cluster. The wafers can be baked on a proximity bake plate such as for example, the post exposure bake (PEB) is performed on FSI's Transient Thermal Unit (TTU) hot plate with a lid temperature of 120 C. A Polaris 2500 cluster is utilized to shrink the wafers by applying 2000 Å of TOK FC-5010 SAFIER as a shrink agent. The SAFIER chemistry can effectively full features such as, vies and slots by shrinking the critical dimension (CD) of the printed slot wafers. The wafers can be processed with the baking process twice in order achieve the desired critical dimension.

The asymmetric strip-loaded slot waveguides described herein can be utilized for the suppression of the second order TE optical mode or TE1 optical mode. The asymmetric strip-loaded slot waveguides can be also employed for achieving an enhanced coupling with a curved coupler from a ridge waveguide. The fabrication method disclosed herein may not be limited to fabricate the asymmetric slotted waveguides; the proposed method can be alternatively employed to fabricate the symmetric slotted waveguides. The fabrication method for the symmetric slotted waveguides requires a separate step for slot etching. The asymmetric waveguide and method of fabrication described herein therefore permits the slots to be shrunk through a wide range of processes (such as SAFIER or use of side all spacers) to the sub-lithographic dimensions.

BRIEF DESCRIPTION OF THE DRAWINGS

The accompanying figures, in which like reference numerals refer to identical or functionally-similar elements throughout the separate views and which are incorporated in and form a part of the specification, further illustrate the present invention and, together with the detailed description of the invention, serve to explain the principles of the present invention.

DETAILED DESCRIPTION

The particular values and configurations discussed in these non-limiting examples can be varied and are cited merely to illustrate at least one embodiment and are not intended to limit the scope thereof.

Figure 1:
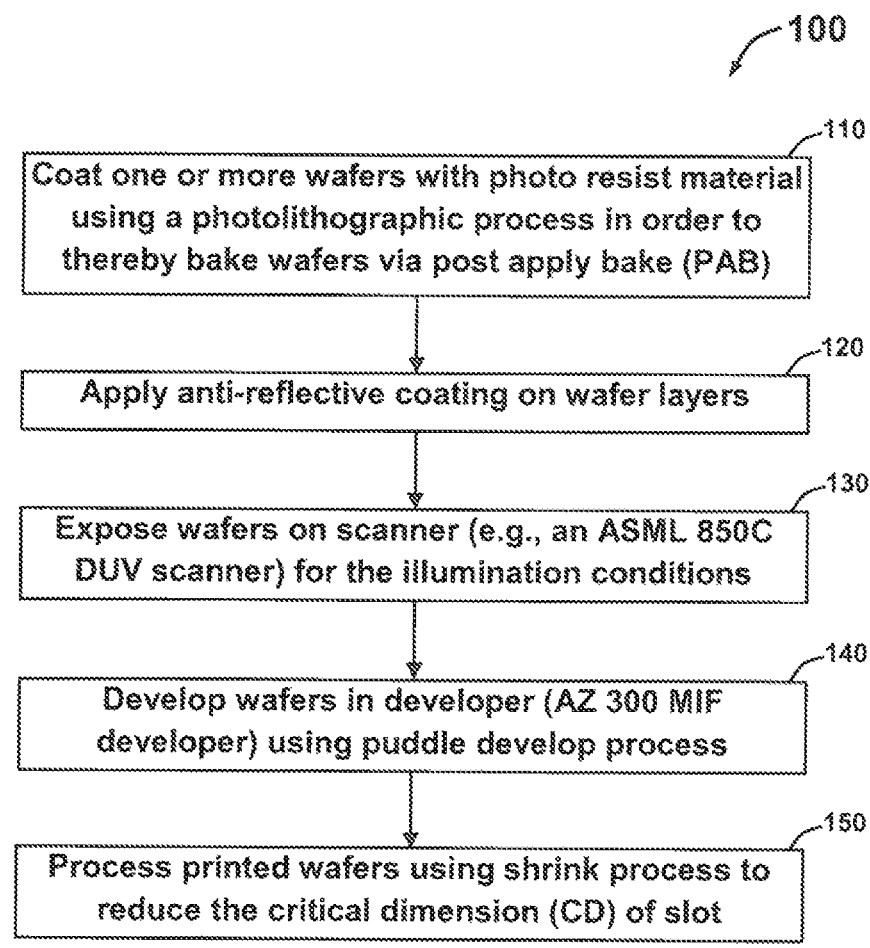
FIG. 1 illustrates a high level flowchart of operation illustrating logical operational steps of a method for fabricating a asymmetric slotted waveguide, in accordance with the disclosed embodiments.

FIG. 1 illustrates a high level flowchart of operation illustrating logical operational steps of a method for fabricating an asymmetric slotted waveguide, in accordance with the disclosed embodiments. The slotted waveguide is constructed in silicon-on-insulator using a Complementary metal-oxide-semiconductor (CMOS) process. Silicon-on-Insulator Resonators comprising high-Q micro rings were fabricated from thin silicon-on-insulator (SOI) layers. Measured Q values of 45 000 were observed in these rings, which were then improved to 57 000 by adding a PMMA cladding. Various waveguide designs were calculated, and the waveguide losses were analyzed. It is recognized that several forms of silicon on insulator, such as SOI comprising wafers having a silicon oxide layer fabricated on silicon, or such as silicon on sapphire (SOS) can be used in different embodiments.

In accordance with the disclosed embodiment, wafer geometries were selected that minimize the thickness of the SOI waveguiding layer as well as the buried oxide, but still yield low loss waveguides and bends. A number of different waveguide widths were compared by finite difference based mode solving. Such a configuration supports only a single well-contained optical mode for near infrared wavelengths.

Note that the Complementary metal-oxide-semiconductor (CMOS) process is a technology for constructing integrated circuits. CMOS technology can be employed in a wide range of circuit application such as, for example, but not limited to microprocessors, microcontrollers, static RAM, and other digital circuits. CMOS technology is also used for several analog circuits such as image sensors (CMOS sensor), data converters, and highly integrated transceivers for many types of communication. CMOS is also sometimes referred to as complementary-symmetry metal-oxide-semiconductor (or COS-MOS). The terms "complementary-symmetry" refer to the fact that the typical digital design style with CMOS uses complementary and symmetrical pairs of p-type and n-type metal oxide semiconductor field effect transistors (MOSFETs) for logic functions.

One or more wafers can be coated with a photo resist material using a photolithographic process in order to thereby bake the wafers via a post apply bake (PAB) process, as depicted at block 110. A standard photolithographic process (e.g., a standard 248 nm DUV photolithographic process) can be adapted to coat the photo resist material on the wafers. An additional shrinking process can be performed to shrink the critical dimension of the features of the printed wafer. In general, photolithography is a process used in micro fabrication to selectively remove parts of a thin film or the bulk of a substrate. It uses a light source to transfer a geometric pattern from a photo mask to a light-sensitive chemical "photo resist", or simply "resist," on the substrate (e.g., the wafer). A series of chemical treatments then either engraves the exposure pattern into, or enables deposition of a new material in the desired pattern upon, the material underneath the photo resist.

An anti-reflective coating (TARC) can be further applied on the wafers and the wafers can be exposed on a scanner (e.g., an ASML 850 C DUV scanner) for the illumination conditions, as illustrated at blocks 120 and 130. The anti-reflective coating (TARC) applied on the wafers can be such as, for example, an AZ Electronics Aquatar VII at a thickness of 430 A. The anti-reflective coating can be an aqueous material that is removed from the wafers during the puddle develop process. After a post exposure bake (PEB), the wafers can be developed in a developer (AZ 300 MIF developer) using a puddle develop process (a single 60 s puddle develop process), as described at block 140. The coat/develop portion of the puddle develop process can be performed on a FSI Polaris 2500 Lithography cluster. The wafers can be baked on a proximity bake plate such as for example, the post exposure bake (PEB) is performed on FSI's Transient Thermal Unit (TTU) hot plate with a lid temperature of 120 C.

The printed wafers can be processed using a shrink process to reduce the critical dimension (CD) of the slot and thereby achieve an enhanced asymmetric slotted waveguide that is capable of guiding the optical radiation in a wide range of optical modulation applications using an electro-optic polymer cladding, as illustrated at block 150. A Polaris 2500 cluster is utilized to shrink the wafers by applying 2000 A of TOK FC-5010 SAFIER as a shrink agent. The SAFIER chemistry can effectively full features such as, visa and slots by shrinking the critical dimension (CD) of the printed slot wafers. The wafers can be processed with the baking process twice in order achieve the desired critical dimension.

While the disclosed embodiments have been particularly shown and described with reference to a preferred embodiment, it will be understood by those skilled in the art that various changes in form and detail may be made therein without departing from the spirit and scope of the invention.

Figure 2:
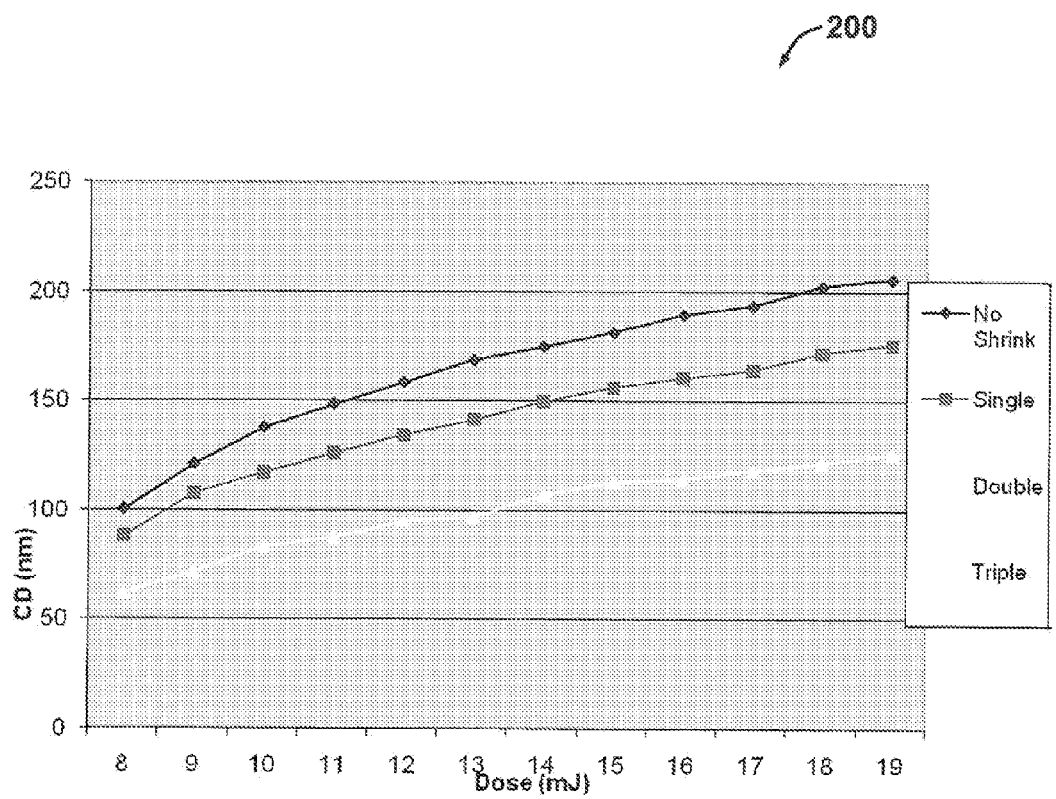
FIG. 2 illustrates a graph representing the critical dimension (CD) of the asymmetric slotted waveguide, in accordance with the disclosed embodiments.

FIG. 2 illustrates a graph 200 representing the critical dimension (CD) of the asymmetric slotted waveguide, in accordance with the disclosed embodiments. The X-axis of the graph 200 represents the dose of the shrink agent applied on the waveguides. The Y-axis of the graph 200 represents the critical dimension of the asymmetric slotted waveguide. The slotted Waveguide can be generally made of a silicon core and surrounding layers of cladding. Silicon core in a cross sectional view can have at least one possible shape, such as, a square, a rectangle, a trapezoid or other form. Those skilled in the art of the fabrication of integrated circuits can use any of a variety of well known processing methods and techniques to form the elements and layers.

The asymmetric strip-loaded slot waveguides described herein can be utilized for the suppression of the second order TE optical mode or TE1 optical mode. The asymmetric strip-loaded slot waveguides can be also employed for achieving an enhanced coupling with a curved coupler from a ridge waveguide. The fabrication method disclosed herein may not be limited to fabricate the asymmetric slotted waveguides; the proposed method can be alternatively employed to fabricate the symmetric slotted waveguides. The fabrication method for the symmetric slotted waveguides requires a separate step for slot etching. The asymmetric waveguide and method of fabrication described herein therefore permits the slots to be shrunk through a wide range of processes (such as SAFIER or use of sidewall spacers) to the sub-lithographic dimensions.

It will be appreciated that variations of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

What is claimed is:

1. A method for fabricating an asymmetric slotted waveguide, said method comprising:
   coating at least one wafer with a photo resist material using a photolithographic process in order to thereby bake said at least one wafer via a post apply bake process;
   applying an anti-reflective coating on said at least one wafer by exposing said at least one wafer on a scanner for the illumination conditions in order to thereby develop said at least one wafer in a developer using a puddle develop process; and
   processing said at least one wafer using a shrink process to reduce a critical dimension (CD) of said wafer and to thereby achieve an enhanced asymmetric slotted waveguide that is capable of guiding optical radiation in a wide range of optical modulation applications using an electro-optic polymer cladding.

2. The method of claim 1 further comprising constructing said slotted waveguide in a silicon-on-insulator using a Complementary metal-oxide-semiconductor process.

3. The method of claim 1 further comprising:
   adapting a standard photolithographic process to coat said photo resist material on said at least one wafer; and
   performing a shrinking process to shrink said critical dimension of features of said at least one wafer.

4. The method of claim 1 further comprising removing said anti-reflective coating from said at least one wafer during said puddle develop process.

5. The method of claim 1 further comprising employing said asymmetric slotted waveguide for the suppression of a second order TE optical mode and TE1 optical mode.

6. The method of claim 1 comprising achieving enhanced coupling with a curved coupler with said asymmetric slotted waveguide.

7. The method of claim 1 wherein said developer comprises a AZ 300 MIF developer.

8. The method of claim 1 wherein said puddle develop process comprises a single 60 s puddle develop process.

9. The method of claim 1 wherein said anti-reflective coating can be an AZ Electronics Aquatar VII at a thickness of 430 A.

10. A product of a method for fabricating an asymmetric slotted waveguide, said method comprising:
    coating at least one wafer with a photo resist material using a photolithographic process in order to thereby bake said at least one wafer via a post apply bake process;
    applying an anti-reflective coating on said at least one wafer by exposing said at least one wafer on a scanner for the illumination conditions in order to thereby develop said at least one wafer in a developer using a puddle develop process; and
    processing said at least one wafer using a shrink process to reduce a critical dimension (CD) of said wafer and to thereby achieve an enhanced asymmetric slotted waveguide that is capable of guiding optical radiation in a wide range of optical modulation applications using an electro-optic polymer cladding.

11. The product of the method of claim 10, wherein the method is further comprising constructing said slotted waveguide in a silicon-on-insulator using a Complementary metal-oxide-semiconductor process.

12. The product of the method of claim 10, wherein the method is further comprising:
    adapting a standard photolithographic process to coat said photo resist material on said at least one wafer; and
    performing a shrinking process to shrink said critical dimension of features of said at least one wafer.

13. The product of the method of claim 10, wherein the method is further comprising removing said anti-reflective coating from said at least one wafer during said puddle develop process.

14. The product of the method of claim 10, wherein the method is further comprising employing said asymmetric slotted waveguide for the suppression of a second order TE optical mode and TE1 optical mode.

15. The product of the method of claim 10, wherein the method is further comprising achieving enhanced coupling with a curved coupler with said asymmetric slotted waveguide.

16. The product of the method of claim 10 wherein said developer comprises a AZ 300 MIF developer.

17. The product of the method of claim 10 wherein said puddle develop process comprises a single 60 s puddle develop process.

18. The product of the method of claim 10 wherein said anti-reflective coating can be an AZ Electronics Aquatar VII at a thickness of 430 A.

* * * * *